(12) United States Patent
Motonaga et al.

(10) Patent No.: US 10,445,438 B1
(45) Date of Patent: Oct. 15, 2019

(54) SURVEYING SPACES AND USAGE INFORMATION OF STRUCTURES FOR FACILITIES MANAGEMENT

(71) Applicant: Syncadd Systems, Inc., Honolulu, HI (US)

(72) Inventors: Irene Nobuko Motonaga, Kaneohe, HI (US); Glen Nobuyoshi Tachibana, Mililani, HI (US); Todd Shigeru Motonaga, Aiea, HI (US)

(73) Assignee: Syncadd Systems, Inc., Honolulu, HI (US)

( * ) Notice: Subject to any disclaimer, the term of this patent is extended or adjusted under 35 U.S.C. 154(b) by 0 days.

(21) Appl. No.: 14/210,192

(22) Filed: Mar. 13, 2014

Related U.S. Application Data

(60) Provisional application No. 61/786,163, filed on Mar. 14, 2013.

(51) Int. Cl.
  *G01C 15/00* (2006.01)
  *G06F 17/50* (2006.01)

(52) U.S. Cl.
  CPC ....... *G06F 17/5004* (2013.01); *G01C 15/002* (2013.01)

(58) Field of Classification Search
  CPC .... G06F 17/5004; G06F 17/50; G01C 15/002
  See application file for complete search history.

(56) References Cited

U.S. PATENT DOCUMENTS

| | | | | |
|---|---|---|---|---|
| 6,446,030 B1 * | 9/2002 | Hoffman | .............. | G01C 15/002 703/1 |
| 6,917,893 B2 * | 7/2005 | Dietsch | ................ | G01C 15/002 702/153 |
| 7,130,774 B2 * | 10/2006 | Thomas | .................. | G06F 17/50 703/1 |
| 7,629,985 B2 * | 12/2009 | McArdle | ............. | G06F 17/5004 345/619 |
| 8,281,495 B2 * | 10/2012 | Hayes | .................. | G01C 15/004 33/1 G |
| 8,943,701 B2 * | 2/2015 | Hayes | .................. | G01C 15/002 33/280 |
| 2004/0122628 A1 * | 6/2004 | Laurie | ................. | G06F 17/50 703/1 |
| 2009/0216438 A1 * | 8/2009 | Shafer | ................. | G01C 21/206 701/414 |
| 2013/0338969 A1 * | 12/2013 | Landes | ............... | G06F 17/5004 703/1 |

* cited by examiner

*Primary Examiner* — Jay Hann
(74) *Attorney, Agent, or Firm* — Martin E. Hsia

(57) ABSTRACT

A process for surveying space and usage information for management of a plurality of adjacent enclosed spaces in a structure by measuring thickness of a wall adjacent to a door's hinge edge, using a rangefinder to measure the distance between the hinge edge and one of the ends of that wall; using the rangefinder to measure the distance between successive vertices to determine lengths of each of the walls, until lengths of all the walls have been determined; and measuring angles of vertices between adjacent walls. The rangefinder transmits the lengths of the walls to a portable computer that is programmed with CAD software that calculates space polygons from the lengths of the walls and the angles of the vertices between adjacent walls and assures that all of the space polygons close. Usage codes are assigned to the spaces and inputted into the portable computer to be associated with the polygons representing those spaces.

6 Claims, 18 Drawing Sheets

Current Art

SURVEYING SPACES AND USAGE INFORMATION OF STRUCTURES FOR FACILITIES MANAGEMENT

This application claims the benefit of U.S. provisional patent application 61/786,163 filed Mar. 14, 2013.

BACKGROUND OF THE INVENTION

This invention relates to a methodology to accurately survey (capture) spaces (exterior and interior) in structures, such as buildings or ships, and usage information for those spaces, for facilities management. The uniqueness of this methodology is based on how to conceptualize and capture a building or other structure to ensure an evolving methodology, to create unlimited building intelligence for business users to rapidly and dynamically understand and see a holistic picture of the information provided. This will enable more informed decisions based on contextual graphics to meet business needs/requirements efficiently, innovatively and cost effectively.

The Efficient production of Effective results is at the core of this methodology for managing buildings and other structures (facilities). Economically and accurately establishing the existing building and other structural inventory, and maintaining the reliability of such an inventory, is fundamental to the efficiency of facilities management and the resulting effectiveness of subsequent business decisions (garbage in is garbage out). Knowing what to measure is also as fundamental to the results as accurately measuring it. To produce effective results for managing facility assets requires an understanding of the "use of the assets", in addition to their size, cost, and location. How space is being used and how well it is being used are keys to the effective use of a facility asset. This requires knowledge of the effective utilization of the asset or, for buildings, the effective use of the available spaces within a building. It is important to understand that space utilization optimization often requires managing multiple virtual sub-spaces within physical spaces that are defined by walls, floors and ceilings. Today's buildings are often designed with minimal walls to reduce constructions costs and maintain use flexibility of the physical spaces. This invention makes it easy to define and maintain both virtual spaces and physical spaces to support automated calculations for space and utilization.

There are millions of existing buildings that have no accurate floor plans to help asset owners manage their building inventory, equipment, furnishings, personnel, and accurately account for them. Typically, government agencies and large asset owners have drawers full of as-built projects drawings, but no updated sets of floor plans of their buildings and other structures. The lack of a repeatable and sustainable methodology to create and maintain what can appear to be a monumental task can cost the business enterprise millions of dollars a year operationally.

The federal government, including military services, is the largest asset owner and manager of facilities. The military services and other federal agencies have laws and regulations that specify how square footages and space utilization should be calculated. The accuracy of their square footages and the use of the buildings and their spaces affect their annual budgets for sustainment, restoration and modernization (also known as operations & maintenance) and space management capabilities help them to make the best use of what they have. This would be a similar case for all state and local governments as well as commercial enterprises.

Another factor that makes this invention a viable solution is the new fiscal reality that is occurring worldwide. Businesses can no longer commit to and absorb costly complex processes and solutions that are time consuming, requiring highly specialized technical skills to acquire and maintain data that's costly and impacts the return on investment. At the same time, businesses cannot sustain themselves by continuing to do the same things the same way and meet the demands of the $21^{st}$ century: faster, more accurate, more intelligent. As Albert Einstein said, "Insanity is doing the same things the same way and expecting different results".

The goal of this invention is to find an innovative way to capture, account for, and maintain accurate and auditable spaces that make up a building or other structure, that would be easier, faster, cheaper, and thereby realize the potential value a floor plan offers, and provide substantially more intelligence and unlimited growth to support future evolution. This helps asset owners obtain an accurate accounting of the buildings and other structures they own, by creating a foundation of object oriented graphical representations of their existing buildings and other structures to help them manage their buildings and structures more accurately and with "ground truth" intelligence. This invention is simple to practice, and does not require specialized training as an engineer, architect or highly skilled technician to capture the buildings and to maintain the changes that occur to the buildings over time.

Typically, a building is captured with Computer Aided Drafting (CAD) software, drawing a floor plan by capturing the building structure, size and layout by lines and/or walls, all connected and intersecting each other to create a floor plan. This method requires a highly skilled CAD operator who is trained and experienced to produce 3-D CAD floor plans.

In the present invention, an existing building and its layout is conceptualized as multiple spaces that are represented by simple single line polygons, creating an object oriented graphical representation of a building's exterior and interior spaces. Each space preferably is assigned a unique identifier and a series of attributes that describe the occupation and use of the spaces that enables accurate and intelligent business capabilities, that is faster to obtain, is cheaper, and easier to maintain/sustain.

SUMMARY OF THE INVENTION

The goal of the process described with this invention is to perform data acquisition for enclosed spaces for facilities management.

Broadly considered, this invention envisions a new way to conceptualize and capture an existing building or other structure that is accurate, standardized, faster, cost effective and offers unlimited future capabilities for more intelligence with innovation. There are two parts to this invention: (1) a simplified and sustainable data acquisition methodology for facilities management; and (2) a re-design of the data acquisition field CAD (computer-aided drafting) system that automates the improved methodology with minimum or no clean-up edits.

The methodology of this invention is contrary to the conventional method of capturing the structural details to create a traditional floor plan and then deriving a space plan from it. The concept and methodology of this invention is to go into a building or other structure to capture the use of its spaces/subspaces, thus eliminating the need for to create a traditional floor plan.

The present invention describes a building by its spaces, rather than its architectural features and construction design, and then attaches usage and other data to the spaces. Based on the class-based spaces/subspaces and data attached to them, this enables innovative ways to symbolize (preferably by color code) each space and publish data by graphically "painting pictures to tell the story" based on the data linked to the space. This methodology captures a building by dimensioning rooms/spaces with laser level/rangefinder devices and angles of vertices between adjacent walls and adjacent boundaries of spaces and subspaces. Information about how each space is used is also captured. The laser measuring device preferably communicates to a mobile computer, such as a tablet, via a short range wireless technology, such as Bluetooth. As a field surveyor uses the laser level/rangefinder to obtain the dimensions of the lengths and widths of the spaces, software (preferably Syncadd's SIMSPACE) converts the dimensions to represent the spaces as polygons, and accurately locates the polygons in relation to each other. The accurate dimensioning and location of the spaces is based on measuring the placement of at least one door in each room from both sides of the wall containing that door. When approaching a building, the technique and sequencing of where to start and how to continue on through the entire building, floor by floor, is key to achieving accuracy and speed. Single physical spaces defined by walls (rooms) may contain multiple subspaces with different uses. Subspaces within a room are represented as separate virtual polygons that, when combined, add up to the total square footage of the room. Similarly, the combined areas of all spaces/rooms in the building add up to the total square footage of the building.

Upon completion, the process provides an automated accurate layout that represents a floor plan and can automatically derive a 3-D floor plan with all of its structural walls with a push of a button. The simple polygon spaces provide flexible and incremental ways to innovate capabilities for intelligence with additional granularity as needed to solve problems and create graphical representations that provide additional perspectives from the space defining data.

This invention is a process that defines the use of a building's spaces that is achieved by a three dimensional survey of structures. A laser level/rangefinder communicates using a short range wireless protocol (Bluetooth) with a tablet or other portable computer. The rangefinder determines the distance in various directions between walls, floors and ceilings (ignoring fixtures and cabinets), or other boundaries that are placed in its sight (such as to indicate boundaries between subspaces, or doors or windows). That information is sent to the tablet computer, where CAD software converts the line segments for each wall or boundary, and the angles of vertices between adjacent walls and adjacent boundaries, into polygons. The software assures that the line segments close the polygons, and also that the polygons align along their vertices and close to define the space/subspace being surveyed. After the polygons are created, the software manages the polygons, instead of the line segments. In other words, the walls and boundaries are initially characterized as line segments (by information from the laser level/rangefinder and measuring of the angles of vertices), and the software assures that the line segments close to form polygons. Thereafter, the software manipulates the closed polygons, instead of the line segments. The software checks that the polygons align along their vertices and form the bounding surfaces of the volume being surveyed. The software also allows visualization of three dimensional spaces by extruding the polygons of spaces or subspaces vertically.

After the polygons and volumes have been captured by the software, they can be linked to a database that can hold data about each volume, such as intended use. Optionally, all the data about the polygons and volumes, and the linked database, can be stored in "the cloud" so that they can be accessed and edited by clients easily from anywhere.

BRIEF DESCRIPTION OF THE DRAWINGS

In prior art, the goal of the data acquisition process was to survey every architectural structural detail to be able to draw a traditional floor plan. In 2009, our manual process took a laser measuring device and programmed it to communicate the lines and distances to a mobile tablet via a short range wireless protocol (Bluetooth). This Bluetooth connection was embedded into a small computer aided drafting (CAD) software to receive the information that was being dimensioned and it drew the lines, directions and distances as it was being measured. This data acquisition field CAD system created a line drawing in a format that made it impossible to directly edit into a full 2-D and 3-D drawing. This meant that the drawings from the data acquisition system had to be imported and converted into the required format, only serve as a template for our CAD operators to trace with a professional architectural software to create a full 2-D and 3-D drawing with all its details to include doors, windows, stairs, columns, etc. Then, we would trace the 2-D drawing to create the polygon spaces and label each space with space type codes. This was a time consuming process that took considerable time, training and experience to achieve a good productive level. This made it challenging to maintain the drawings and also added to the cost.

In October of 2012, we began testing our new and updated methodology and data acquisition field CAD system. The following drawings show how the process is simplified, easier, faster and more intelligent.

Figure 1:
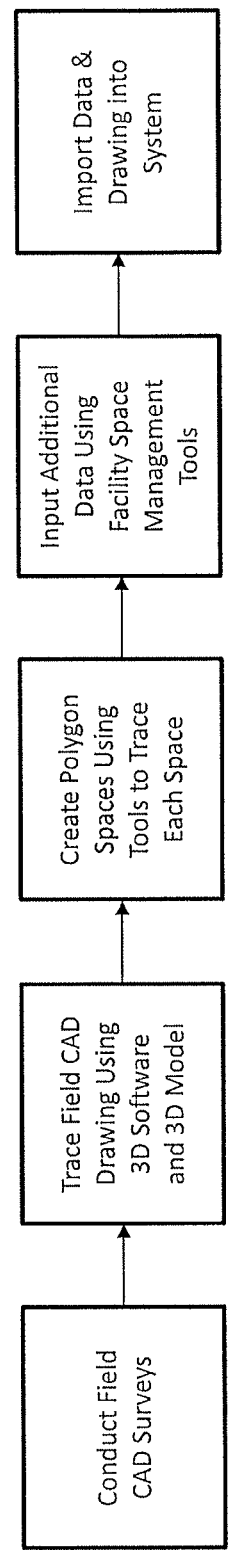
FIG. 1—Prior Art with original process.
Figure 2:
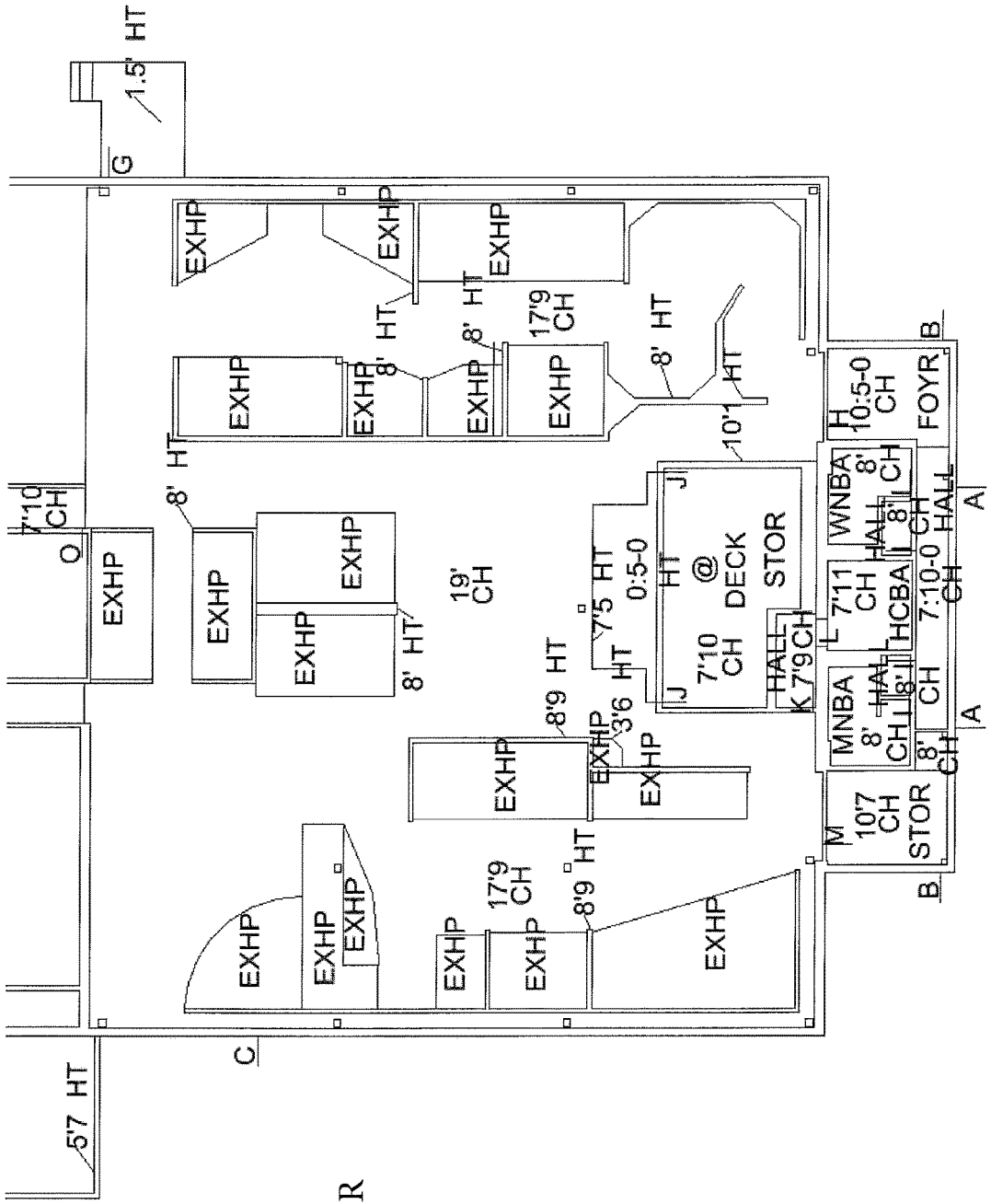
FIG. 2—is a sample of a line drawing (not polygons) created with prior art methodology and tools.
Figure 3:
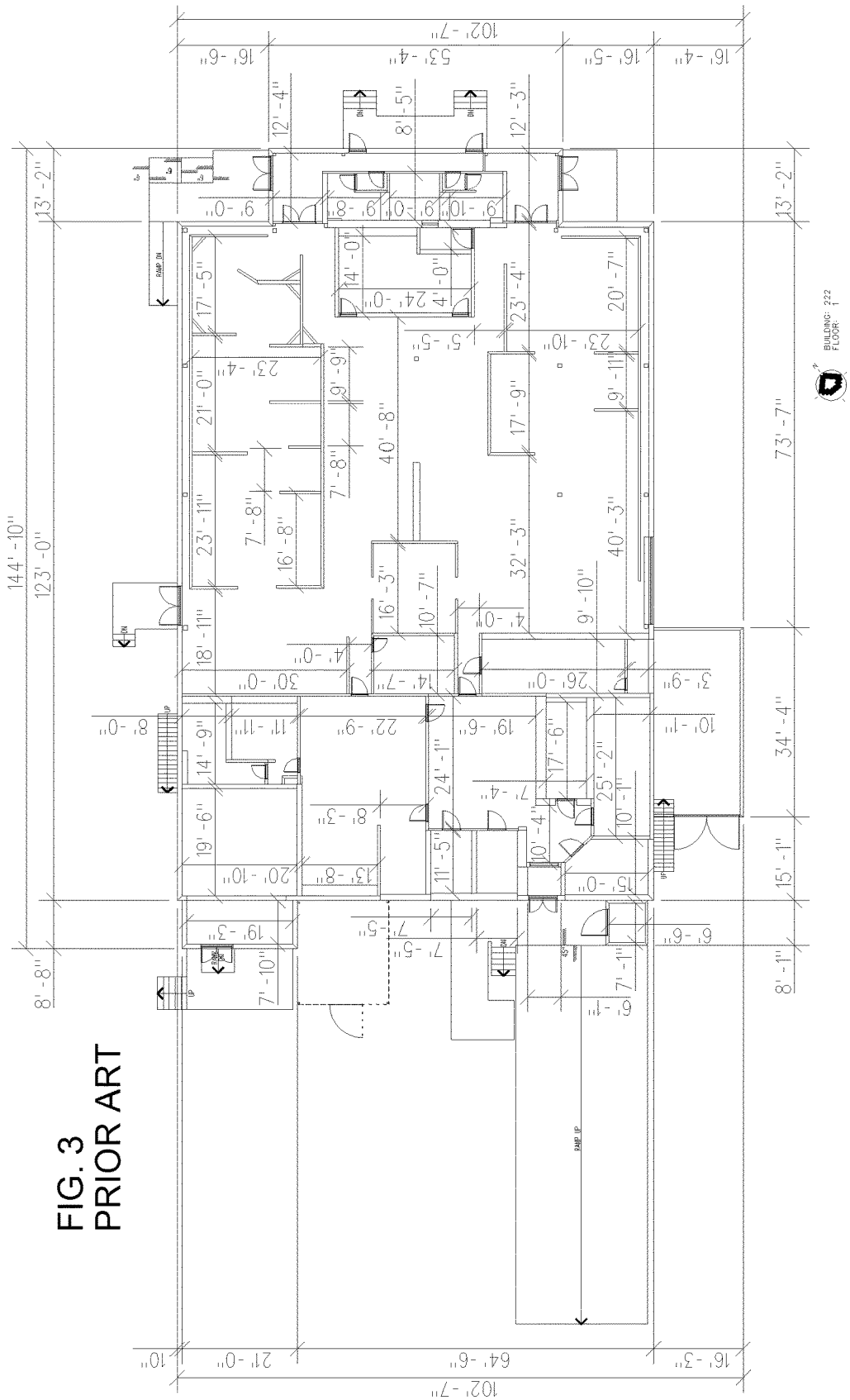
FIG. 3—is a traditional 2-D architectural floor plan that was created by tracing the line drawing like the one in FIG. 2.
Figure 4:
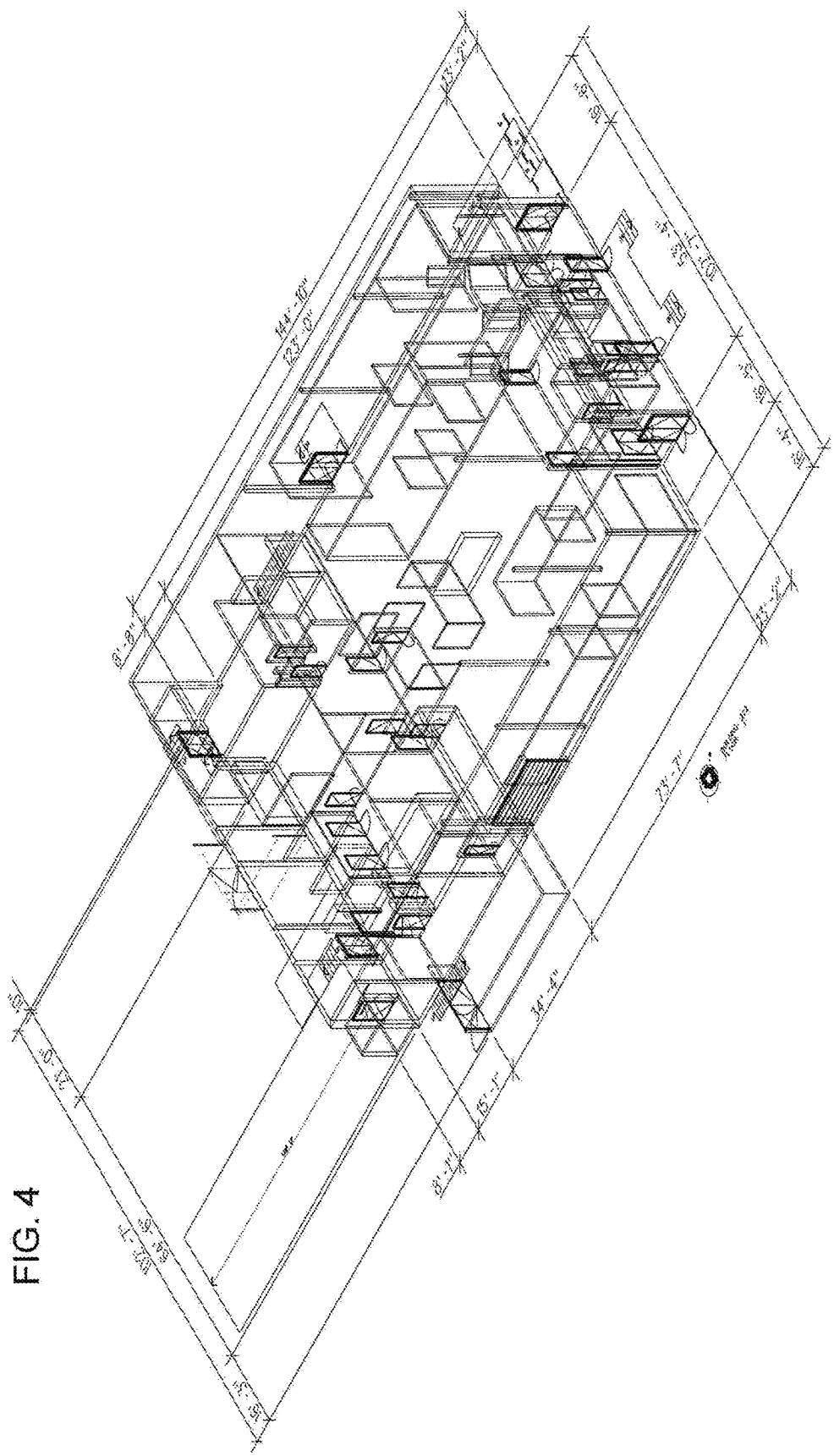
FIG. 4—is an extruded 3-D wireframe drawing showing the complex elements and details required to draw the 3-D.
Figure 5:
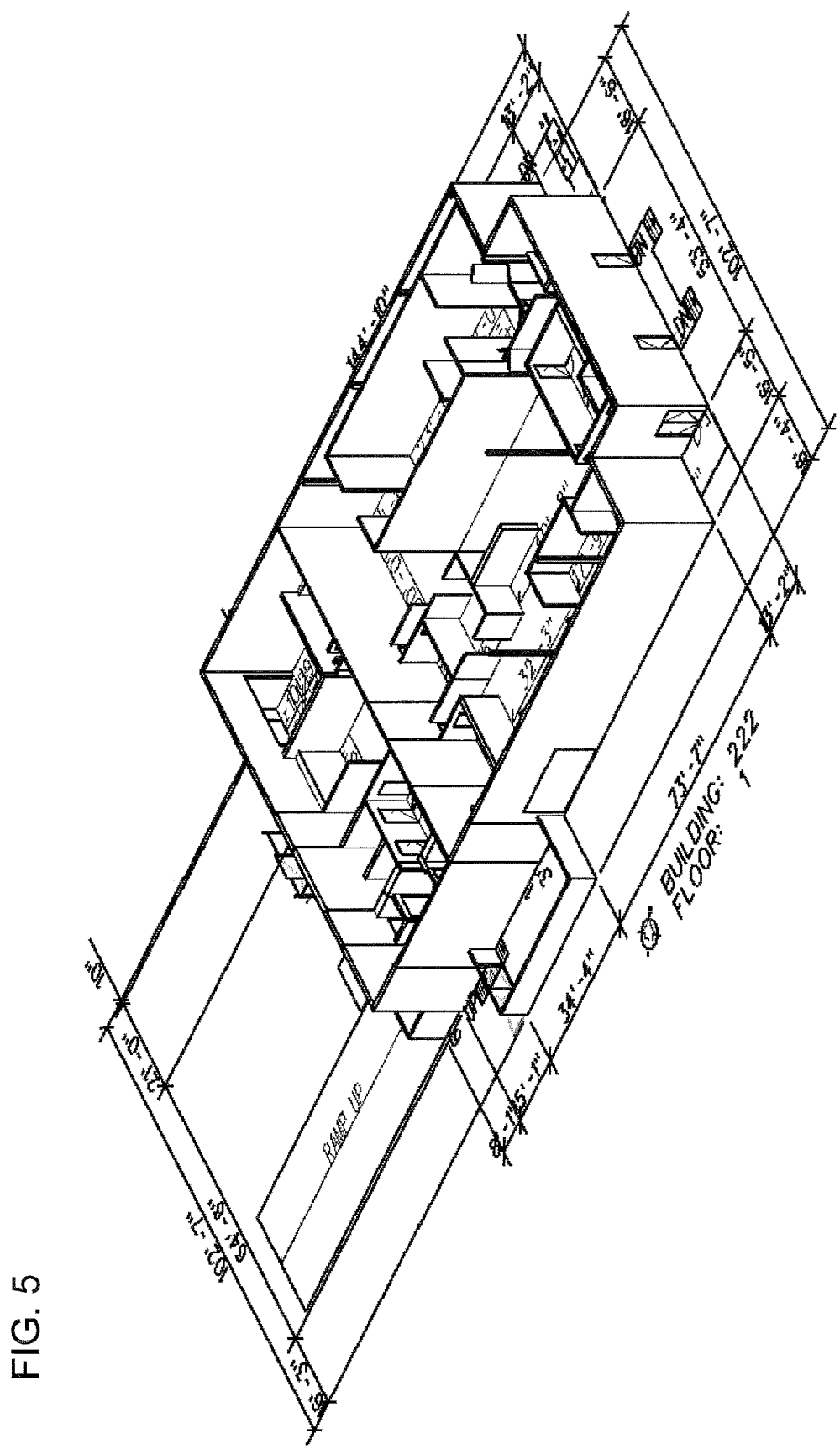
FIG. 5—is a PDF rendered drawing of FIG. 4.
Figure 6:
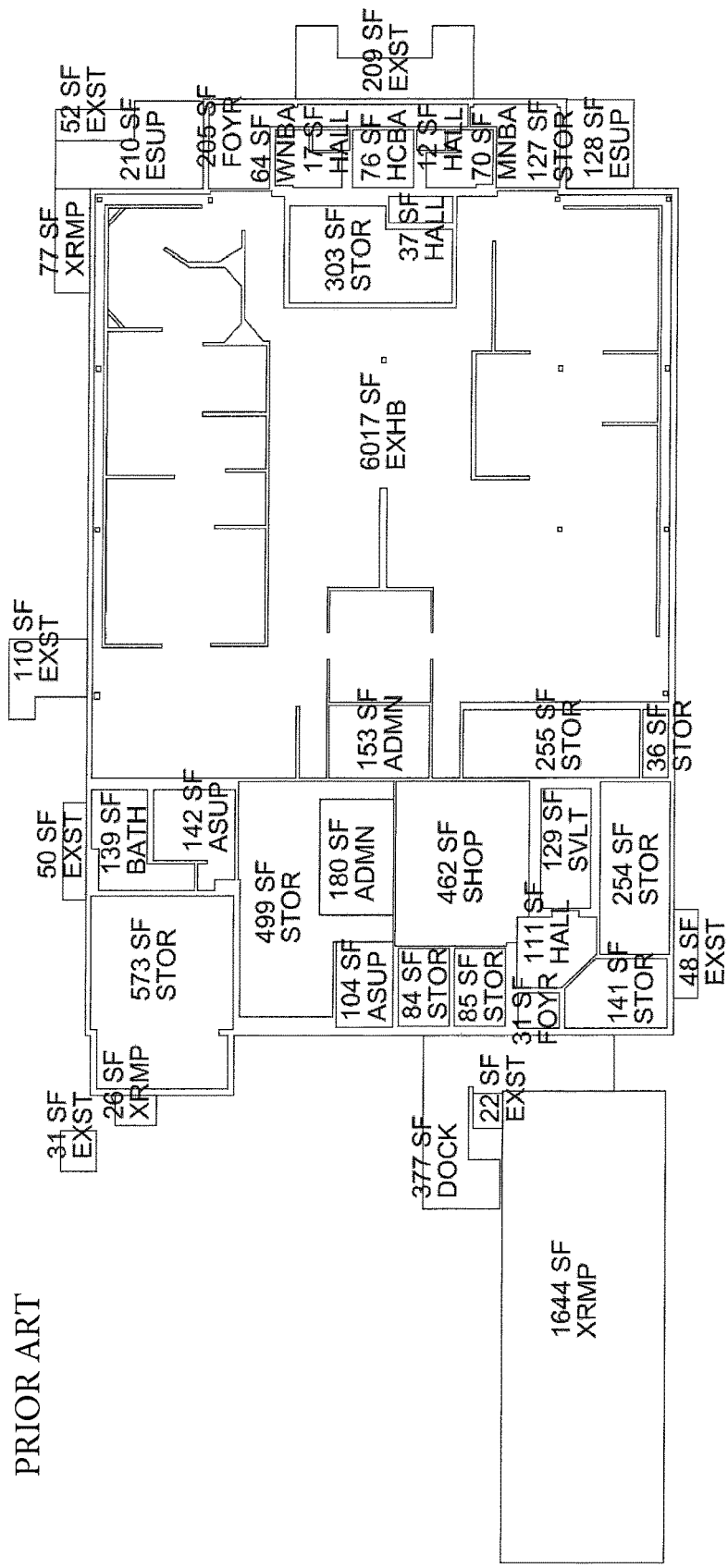
FIG. 6—is a space plan that is derived by tracing the floor plan in FIG. 3.
Figure 7:
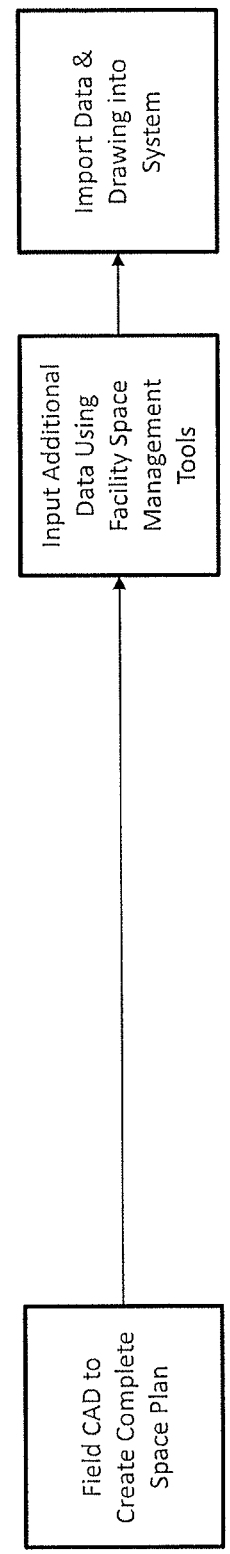

FIG. 7—Current Art with simplified process using our data acquisition field CAD system.

Figure 8:
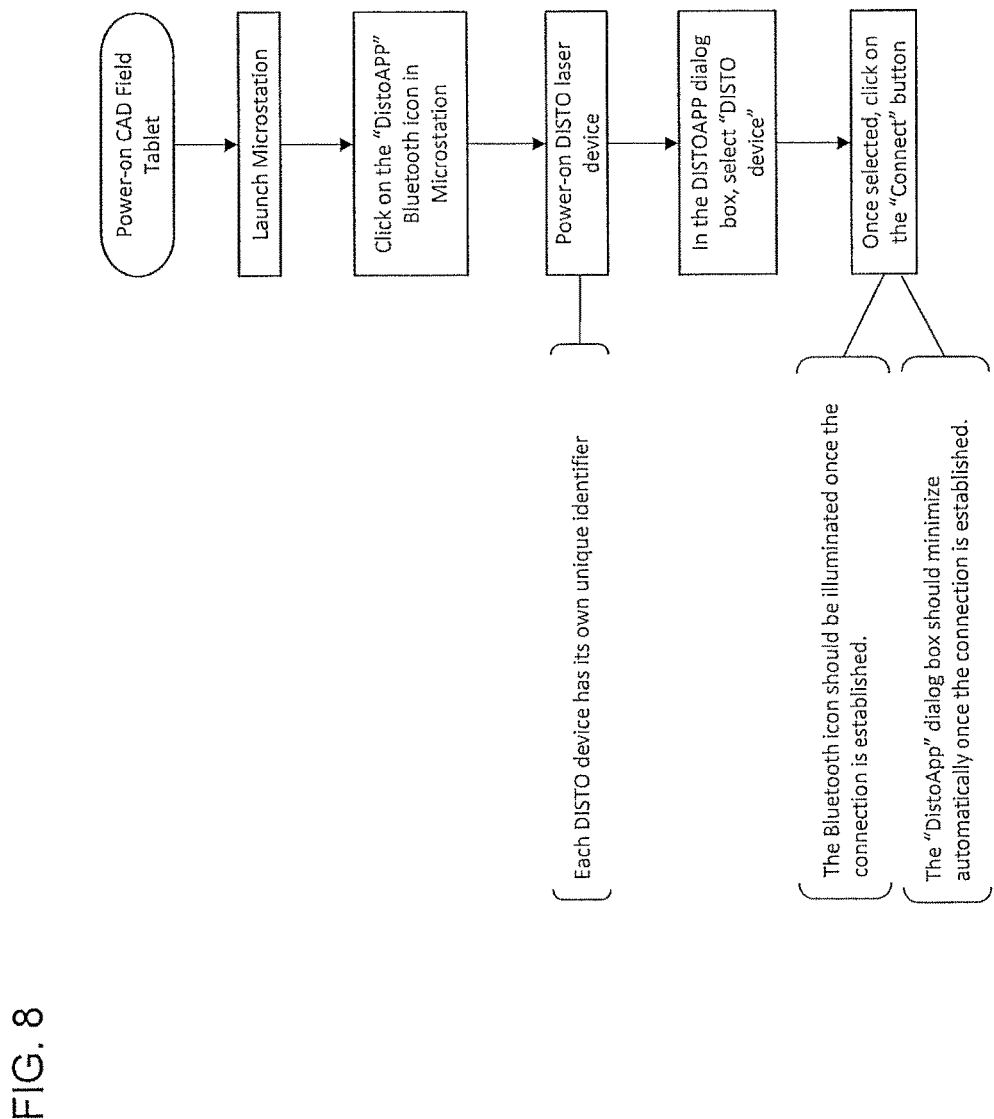

FIG. 8—shows the process flow diagram for connecting the tablet computer with the laser range finder via our Bluetooth DISTOAPP application.

Figure 9:
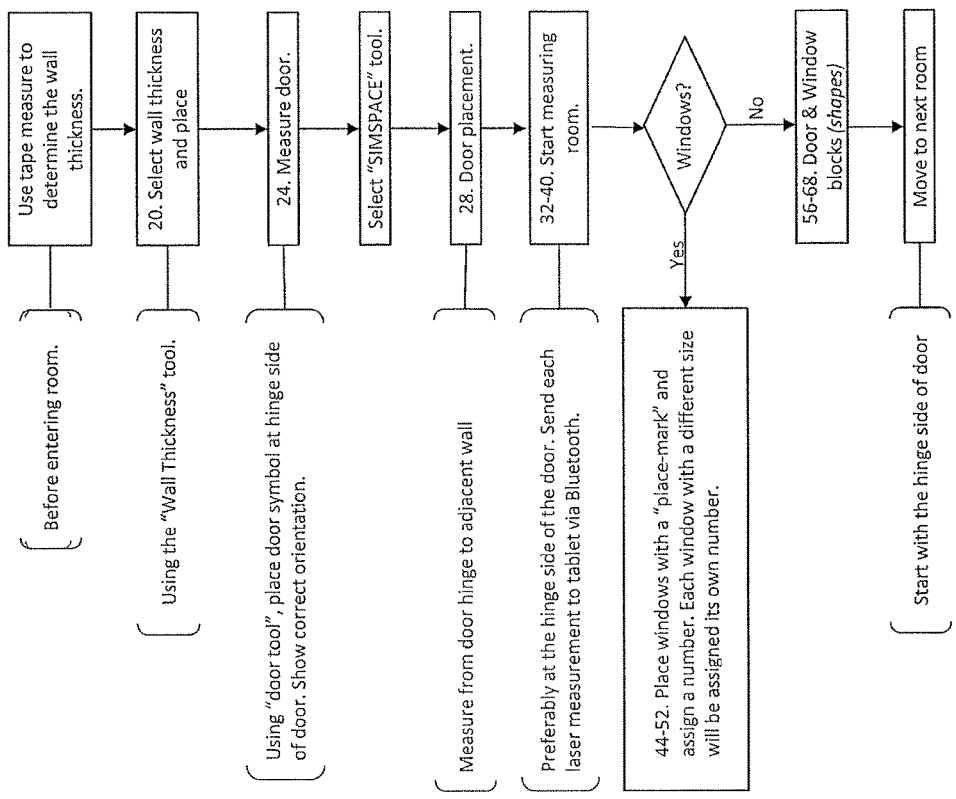

FIG. 9—shows the process flow diagram to measure a space, including door placements and windows.

Figure 10:
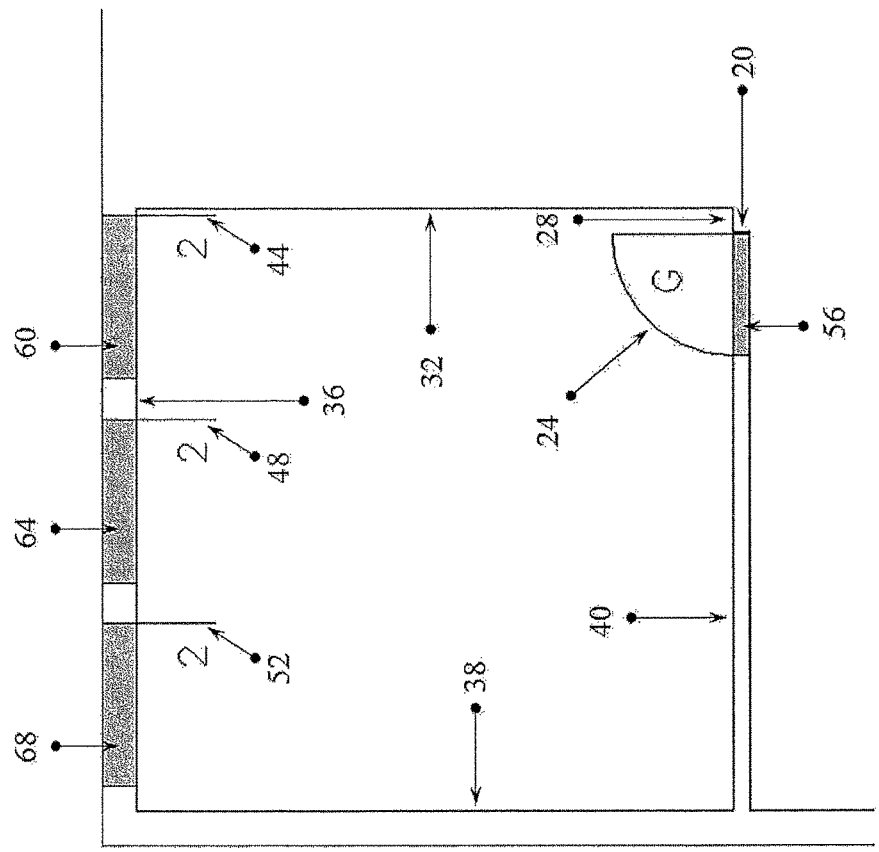

FIG. 10—shows a sample polygon space drawing as documented in FIG. 9.

Figure 11:
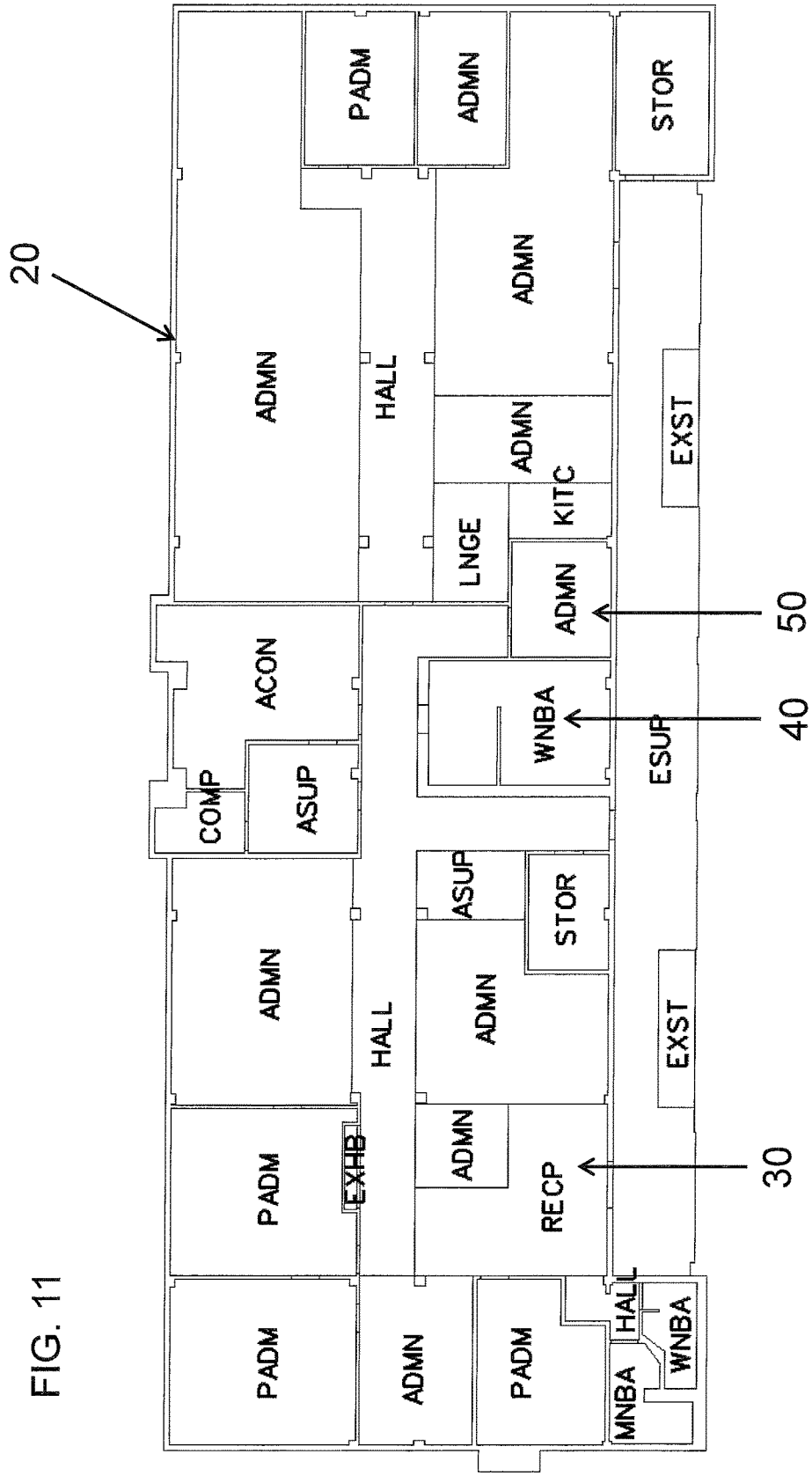

FIG. 11—shows an actual space plan drawing as created from our data acquisition field CAD system. Each space must have a space code.

Figure 12:
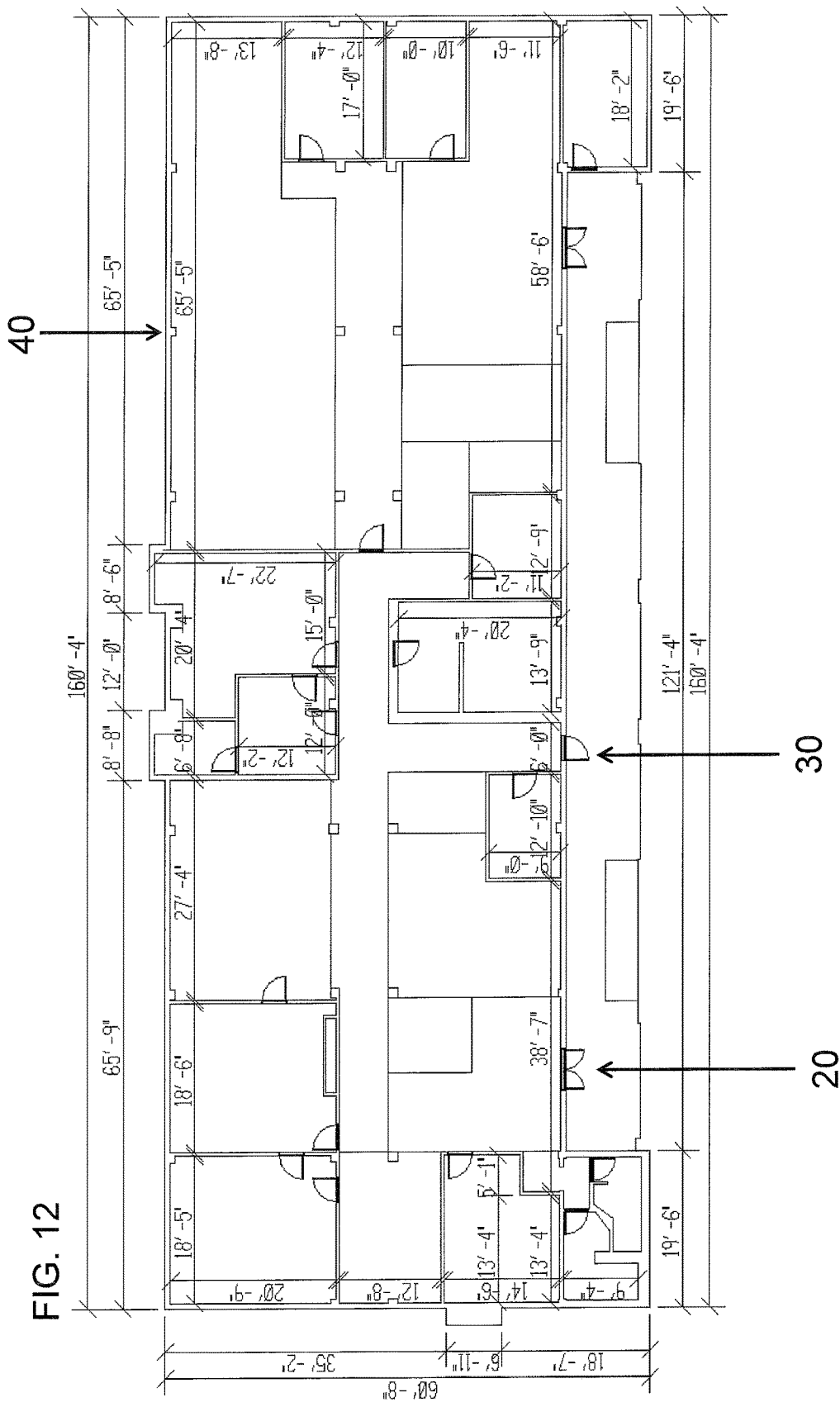

FIG. 12—Shows the same space plan drawing with doors and dimensions added.

Figure 13:
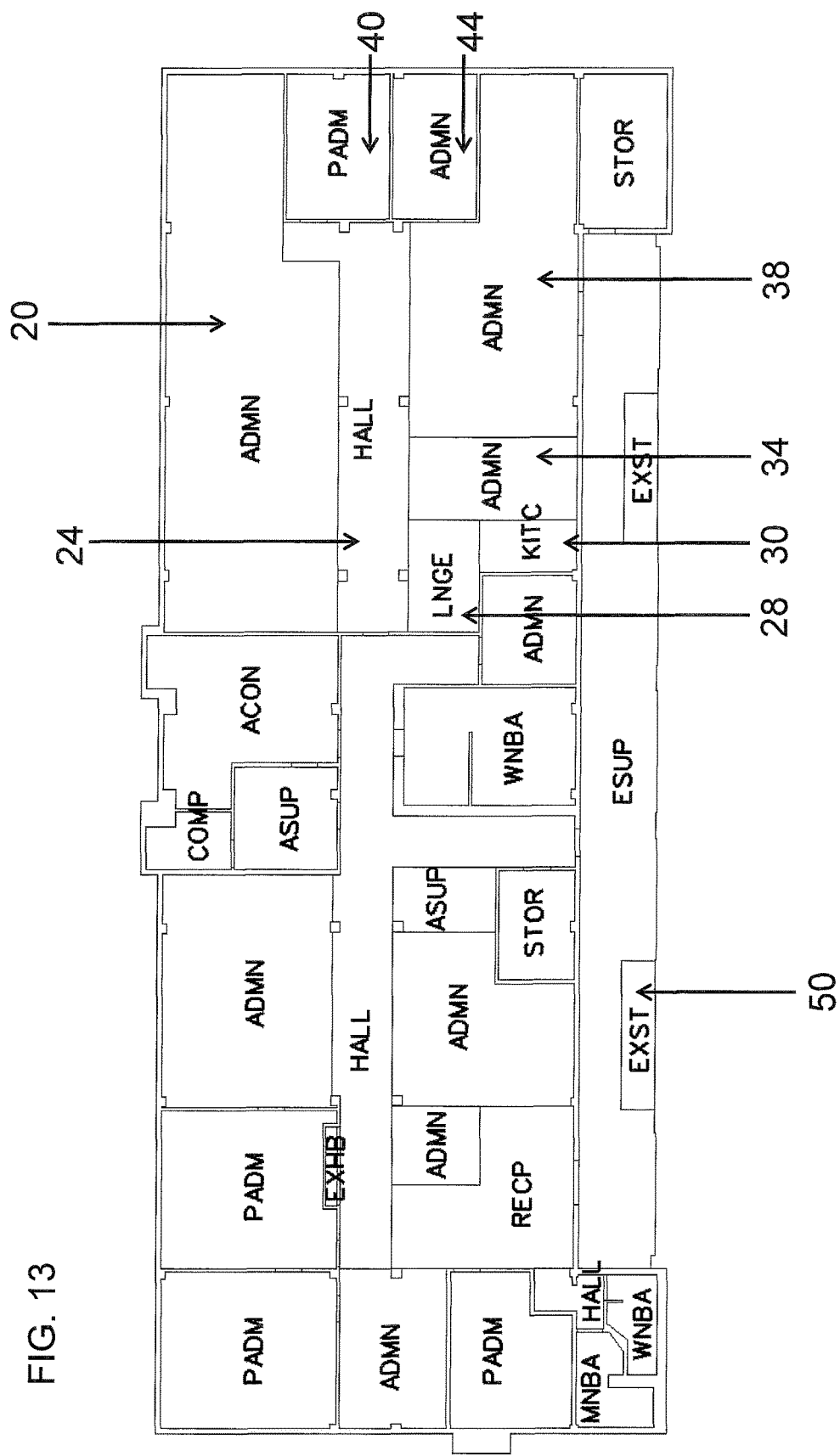

FIG. 13—shows how the polygon spaces/subspaces are created with a single-line and how they interact with each other.

Figure 14:
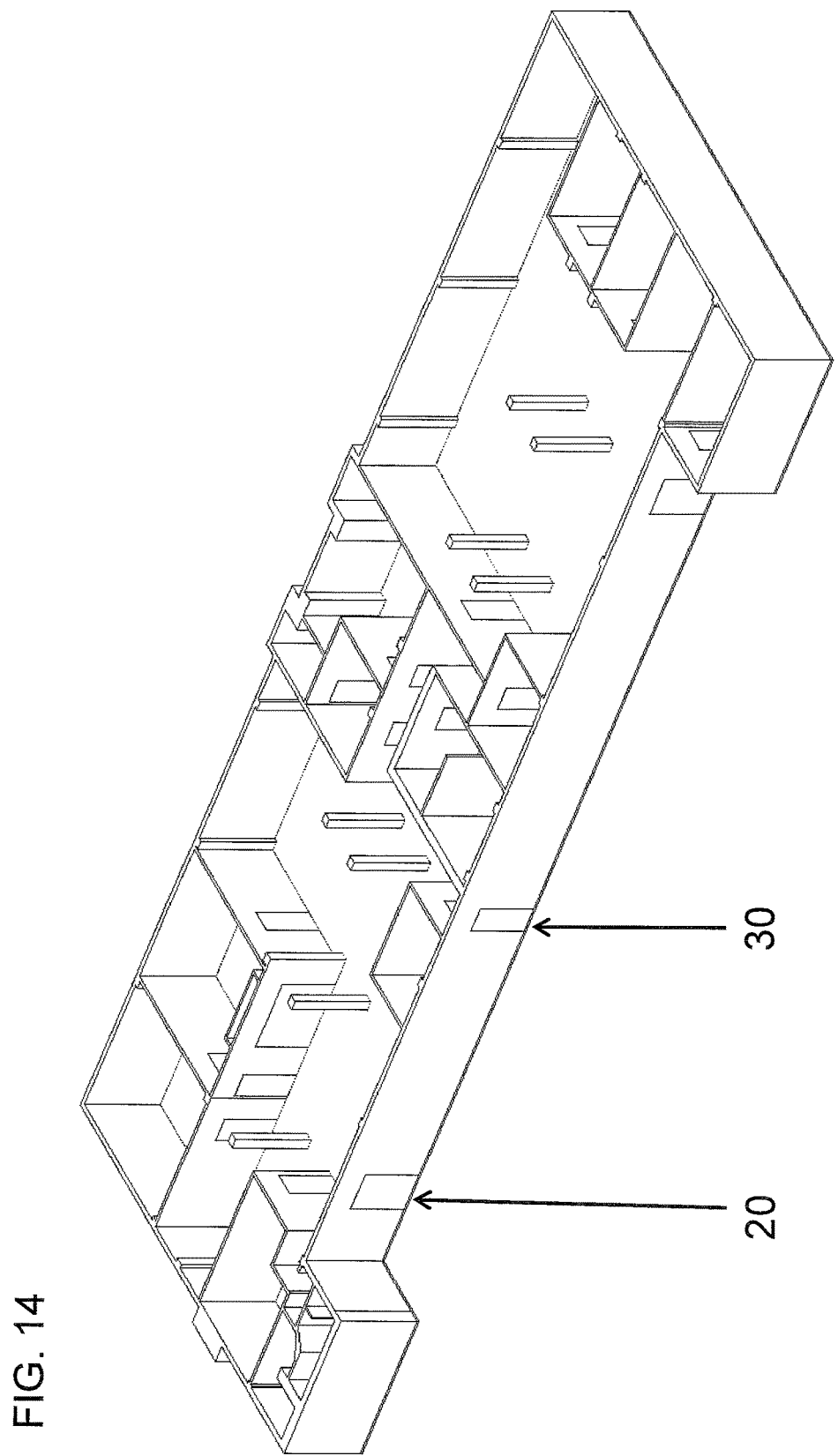

FIG. 14—Automated rendering of FIG. 12 in PDF format being published with Adobe Acrobat.

Figure 15:
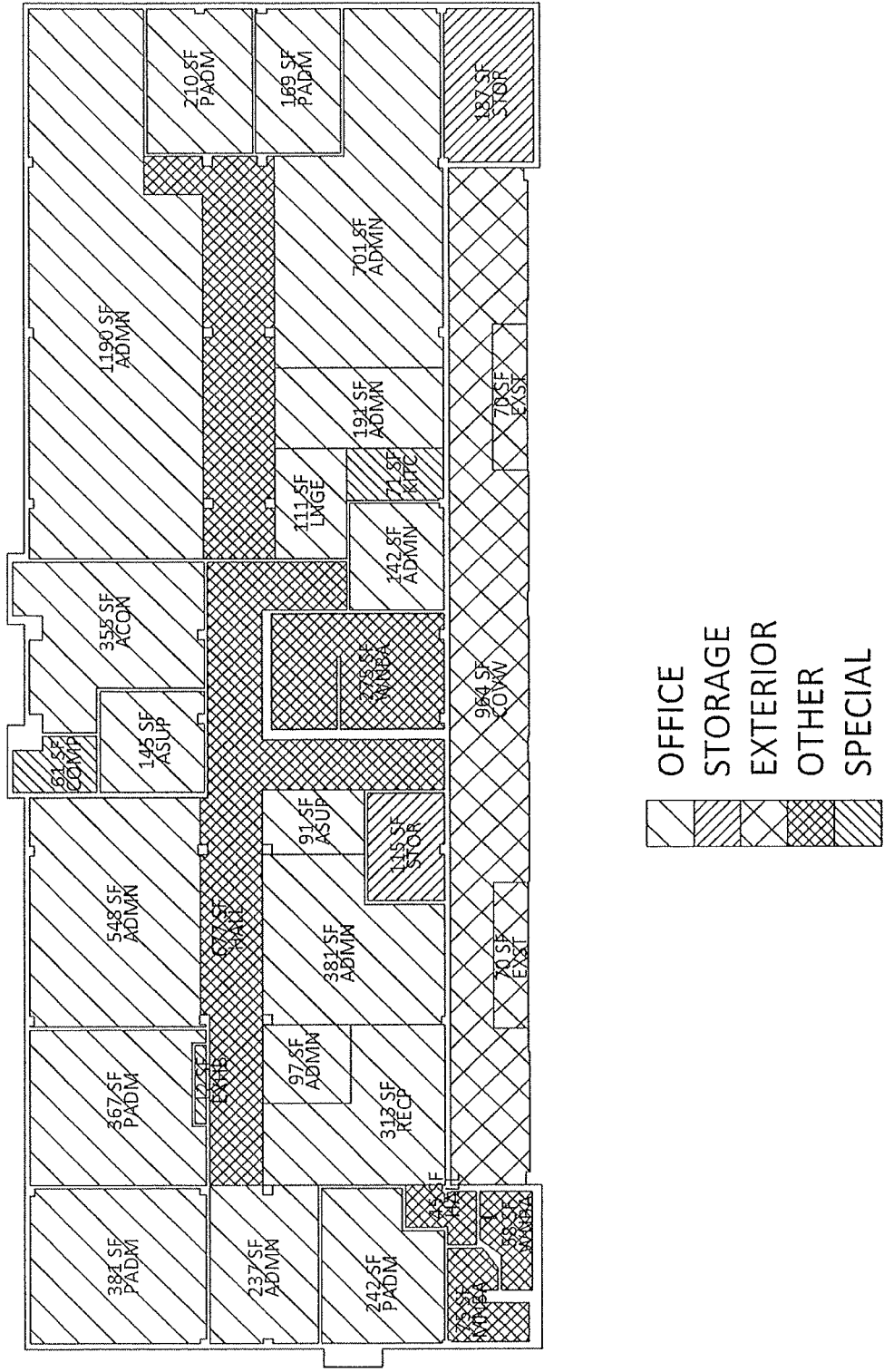

FIG. 15—Shows the spaces reading the database and cross hatching by Space Category. Multiple text labels are available to populate the spaces as needed.

Figure 16:
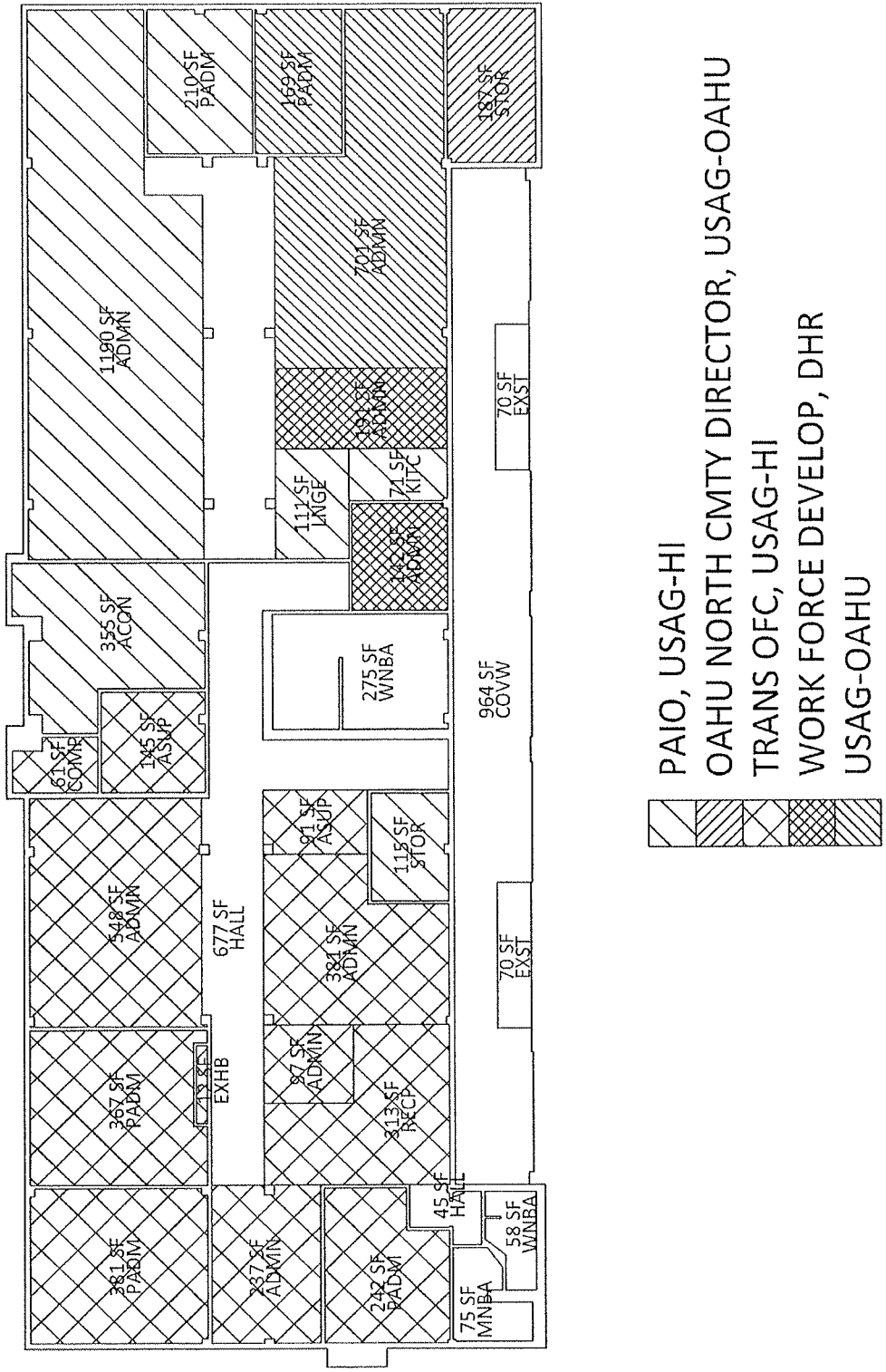

FIG. 16—is a space plan cross hatching by organizations occupying the spaces.

Figure 17:
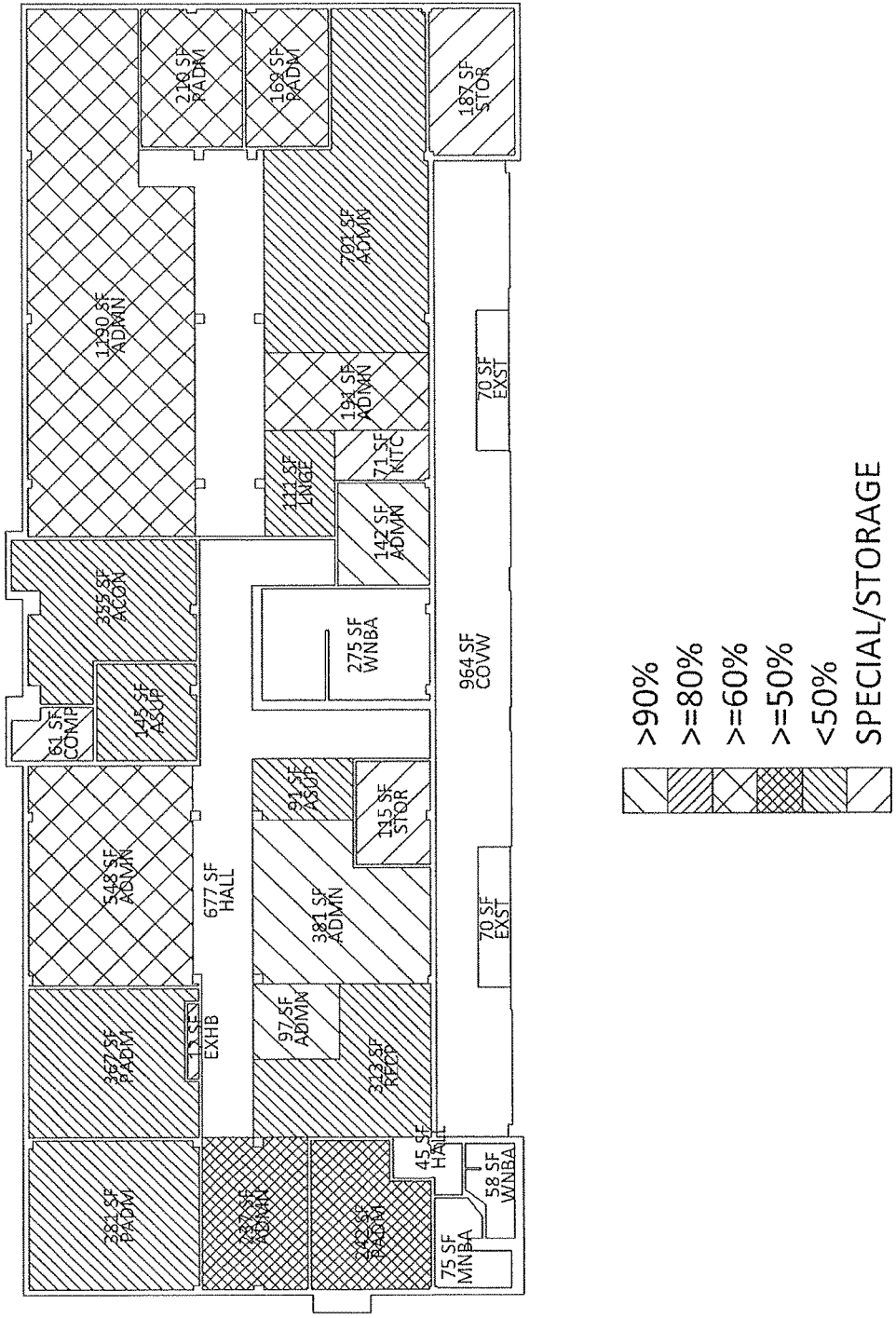

FIG. 17—is a space plan cross hatched by how well the spaces are being used.

Figure 18:
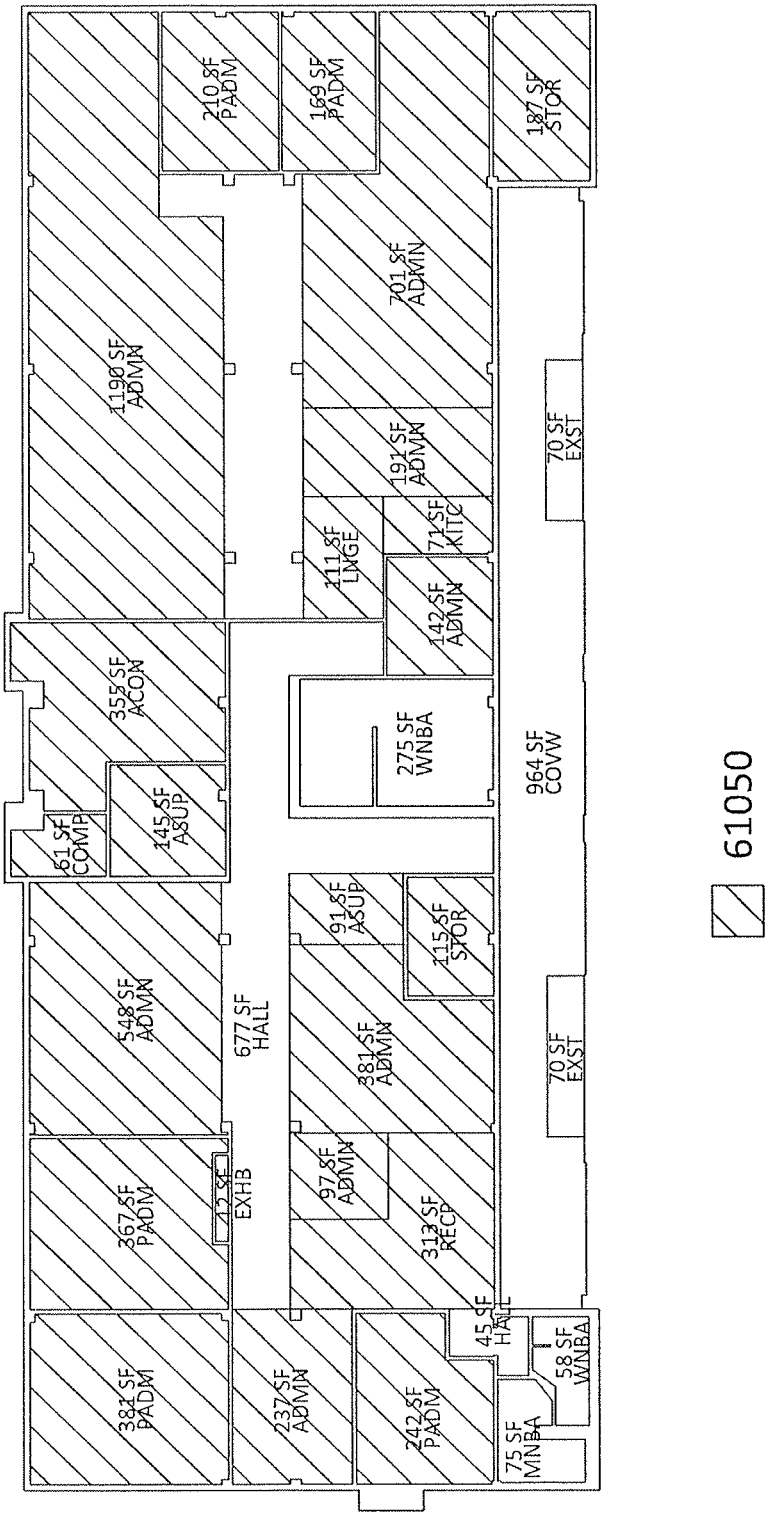

FIG. 18—is a space plan cross hatching by Category Code 61050, an administrative type of building.

DESCRIPTION OF THE PRESENTLY PREFERRED EMBODIMENT

This invention is a process that focuses and defines the use of a building's spaces that is achieved by a methodology and an updated data acquisition field CAD system that automates this methodology.

A data acquisition field CAD system includes a tablet computer and a laser level/range finder, in communication using a short range wireless protocol (preferably Bluetooth). The tablet runs new and independent (not embedded into another software) application software that runs on a computer operating system, preferably the Microsoft Windows Operating System. The laser level/range finder measures ("shoots") the distances in various directions ("line segments") to capture the dimensions of the spaces/subspaces between walls, floors and ceilings, as well as between doors and windows. The spaces and subspaces do not need to be defined by physical walls, floors or ceilings, but can also be defined by virtual boundaries between work spaces and subspaces. Angles of the vertices between adjacent walls and between adjacent boundaries are also measured, using a manual angle measurement tool, or in some other conventional manner. As the laser measured dimensions and angles are acquired ("registered"), the information is dynamically sent wirelessly, to the tablet computer, which converts the line segments and angles for each space into a polygon (closed shape vs. multiple line segments). The data acquisition field CAD system then connects to CAD software (preferably the software presently called MicroStation) that creates a 100% useable space plan file to which attributes, external databases, etc. can be attached to build intelligence.

Once the spaces (closed polygons) have been created, a variety of attributes can be linked to those spaces to facilitate analysis, planning, and decision making. Energy use by space, allocation of costs by space, analysis of costs by space, management of spaces within spaces (manage workstations within a room), define and locate the electrical drops for each workstation, locate all the electrical/network drops in a space, and many other various attributes can be linked to the space to support business analysis and processes.

Referring first to FIG. 8 provides the process to activate the tablet computer with customized CAD tools and a laser level/range finder to achieve a Bluetooth connection.

FIG. 9 is a high level process flow diagram that represents the steps in laser dimensioning a space with the field CAD system. Door and window placements are also part of the process.

The following descriptive steps are identified by corresponding part numbers in FIG. 9 flow diagram and the FIG. 10 Sample Field CAD Drawing.

Before entering the room to measure, use tape measure to measure wall thickness #20.

Using Function Key F5 (0'-5") to place line for the wall thickness.

Preferably, function keys are previously set up as wall thickness tools [i.e F1=1", F2=2", etc].

Preferably with a door tool in the laser level/rangefinder, place the door at the wall thickness line and measure door size #24.

Show correct swing orientation.

Select to start drawing your workspace(s).

Preferably using a "SIMSPACE' tool in the laser level/rangefinder, measure the door dimension from the hinge to the adjacent wall #28.

Use this measurement to position polygon with respect to adjacent space areas.

Align the back or front of the laser level/rangefinder with the hinge of the door.

There are options on the laser level/rangefinder to be set from either the back or front depending on how small of an area is being measured.

From the door placement, continue measuring the room until you end up where you started (the hinge side of door), by using the laser level/rangefinder to measure line segments #32, #36, #38, #40, which correspond to the walls.

Send each laser measurement to tablet via Bluetooth.

The Field CAD system will have created a closed polygon made up of all the room segments measured.

By using the laser level/rangefinder, measure the distances from the rough openings of exterior windows #44, #48, #52 to an adjacent wall #32.

The windows are to be placed with a place mark line and an assigned number (window type #2). Measure the width\height\sill of each window and log those values on a spreadsheet.

Each window of a different size or type will be assigned its own type number.

Place a shape to represent the opening of the door #56, preferably using a 'Place Door Block' tool.

Using the "Place Window Block' tool, place shapes to represent the openings of the windows #60, #64, #68.

Preferably, the Field CAD system will place the window block within the space pursuant to the dimensions and locations measured.

Move on to next adjacent room, again starting with the hinge side of a door.

Repeat steps 20-68 until all workspaces have been created.

Referring to FIG. 11, shown is a space plan drawing created and downloaded directly from the mobile tablet. It will be observed that the space plan has all of the spaces for each element of a traditional floor plan, but everything is represented by a polygon space and a space code, but only minimal information about placement of doors and windows is shown.

It will be observed that the entire drawing is made up of single-line polygon spaces. The accuracy of the spaces and their respective locations is based on the technique of measuring, for one door in each room, door placement from both sides of the wall containing the door.

FIG. 11 #20 represents the building's exterior wall which calculates to the building's gross square feet.

All other spaces represent the interior spaces

FIG. 11 #30 shows that it is a polygon, a single entity closed shape, and not a shape made of six line segments.

Space number FIG #40 and 50 show the space codes "WNBA" (Women's Bathroom) and "ADMN" (Administrative) respectively. Each space requires a space code which describes the use of the space.

Space codes provide the flexibility and granular capability of identifying and locating each space, its use, square footage, usable or unusable, tenants, utilization, category types, etc. By combining the specific space and applying a space code, each space becomes an object, to which one or more space and other codes are attached, to provide a unique signature for each object. This signature can then provide the basic building block to a graphic database allowing other attributes of the space to further define the object.

Unique on to itself, this combination of specific area of the object and assigned codes provide a unique signature for each object. This signature can then provide the basic building block to a graphic database allowing other attributes of the space to further define the object. Each object can then be queried through a comparison of the attributes to play out growth scenarios as well as operations & maintenance and capital improvement allocations across all facilities in the database. The power lies in being able to query a building for multiple purposes and decision making.

FIG. 12 shows how spaces captured to represent its use can be dimensioned like a traditional floor plan with the same accuracy. Door placements are shown and contribute to the accurate location of the spaces within the floor.

FIG. 13 It will be observed that some spaces seem to have single lines and some seem to show double lines. The uniqueness of this methodology is its simplicity.

FIG. 13 #50 is laser measured space coded "EXST", which means it is the exterior stairs and its polygon shape will accurately calculate to the actual area that it occupies. Rather than taking the time to obtain detailed data (the number of stairs, the rise (height) and run (depth) of each stair, its up/down direction) and then drawing the details of it, a polygon space and space code is sufficient for facilities space management.

Every polygon space is drawn with a single line. FIG. 13 virtual subspaces #20, #24, #28, #30, #34, #38 are all depicted with no walls between them. These polygons were created because there are several organizations occupying a space within a single large room (see FIG. 14). For space utilization purposes, the various organizations need to be tracked.

These virtual (simulated) subspaces appear to share the same line between them but this is not the case. Instead, these polygons share the same plane on which the line exists.

FIGS. 13 #40 and #44 appear to be drawn with parallel lines, but this is not the case. The appearance of the parallel lines are created because the accuracy of space placements is based on the wall thickness in relation to the next space.

As mentioned before, the accuracy of the spaces and their locations is based on the technique of measuring, for one door in each room, door placements from both sides of its wall.

The surprising end state result is that everywhere there are parallel lines showing means there is a structural wall there.

FIG. 14 shows the results of how we automate the conversion of the 2D spaces into a finished 3D rendering by extruding the single-line polygon spaces utilizing MicroStation and publishing a 3D PDF.

FIG. 14 #20 (double door) and #30 (single door) are the results of FIG. 12 door placements #20 and #30.

Architects focus on drawing the walls of a building and deriving spaces from those walls. In the present invention, for existing buildings, this process is inverted by capturing accurate dimensions and locations of the spaces, and then deriving the structural walls of the building.

FIG. 15 through FIG. 18—show the examples of the spaces linked to attributes and publishing (preferably) colored spaces in response to queries made (with cross hatching substituted for the preferred color coding in the attached drawings).

FIG. 15 is a Space Plan cross hatched (although preferably color coded) by Space Category with Space Codes and area in square feet.

FIG. 16 is a Space Plan cross hatched (although preferably color coded) by Organization FIG. 17 is a Space Plan cross hatched (although preferably color coded) by Space Utilization Ratio FIG. 18 is a Space Plan cross hatched (although preferably color coded) by use Category Code Once the spaces are populated with the information and linked to external databases, scripts can be written to search, simulate, and predict changes in facility allocation based on applied parameters. The unlimited spatial granularity of spaces coupled with the unlimited information that can be linked to spaces, groups of spaces, floors, buildings, category of buildings, buildings by locations, etc. provides an innovative way to solve facilities management problems and provide contextual insights.

What is claimed is:

1. A process for surveying spaces and how each space is being used for management of a plurality of adjacent enclosed spaces in an existing structure, each space being defined by a plurality of walls, each wall meeting a neighboring wall at a vertex, at least one of said walls being a door wall having a wall thickness containing a door and two ends at vertices where said door wall meets neighboring walls, at least one of said spaces containing at least one virtual subspace having a usage that is different from how said space is used, said subspace being defined by at least one non-structural boundary, each of said non-structural boundaries having a vertex where said non-structural boundary meets a neighboring wall or non-structural boundary, comprising:

measuring said thickness of said door wall, said door wall partially defining one of said enclosed spaces in said existing structure;

using a rangefinder to measure the placement of said door from both ends of said door wall;

starting with one of said ends of said door wall, using said rangefinder to measure the distance between successive vertices to determine lengths of each of said walls defining said enclosed space in said existing structure and each of said non-structural boundaries defining a subspace having a usage contained in said space, until lengths of all said walls and non-structural boundaries have been determined;

measuring angles of vertices between adjacent walls and non-structural boundaries;

wherein said lengths of said walls and non-structural boundaries are dynamically sent wirelessly by said rangefinder, and said angles of vertices between adjacent walls and non-structural boundaries; are dynamically sent wirelessly, to a mobile computer, wherein said mobile computer is programmed with CAD software that calculates space polygons representing said spaces and subspaces from said lengths of said walls and non-structural boundaries and said angles of vertices between adjacent walls and non-structural boundaries and assures that all of said space polygons close;

capturing information about how each space and subspace in said existing structure is used;

based on said captured information, assigning usage codes to said spaces and subspaces for how each space and subspace is used and inputting said usage codes into said portable computer to be associated with the polygons representing those spaces and subspaces;

whereby space and usage information for said spaces and subspaces within said existing structure is surveyed, eliminating the need to create a floor plan that captures structural details.

2. A process according to claim 1, further comprising:

after said space polygons for a space have been closed, proceeding to a succeeding adjacent space and repeating the above steps for each adjacent space until all said spaces and subspaces in said structure have been surveyed.

3. A process according to claim 1, further comprising extruding said space polygons to create 3 dimensional representations of said spaces and subspaces.

4. A process for surveying spaces and how each space is used for management of a plurality of adjacent enclosed spaces in an existing structure, each space being defined by a plurality of walls, each wall meeting a neighboring wall at a vertex, at least one of said walls being a door wall having a wall thickness, two ends at vertices where said door wall meets neighboring walls, and a door having a hinge edge installed in said door wall between said ends, at least one of said spaces containing at least one virtual subspace having a usage that is different from how said space is used, said subspace being defined by at least one non-structural boundary, each of said non-structural boundaries having a vertex where said non-structural boundary meets a neighboring wall or non-structural boundary, comprising:

measuring said thickness of said door wall adjacent to said hinge edge, said door wall partially defining one of said enclosed spaces in said existing structure;

using a rangefinder to measure the distance between the hinge edge of said door and one of said ends of said door wall;

starting with said end of said door wall, using said rangefinder to measure the distance between successive vertices to determine lengths of each of said walls defining said enclosed space in said existing structure, and each of said non-structural boundaries defining a subspace having a usage contained in said space, until lengths of all said walls and non-structural boundaries have been determined;

measuring angles of vertices between adjacent said walls and non-structural boundaries;

wherein said rangefinder is short range wirelessly coupled to a portable computer and transmits said lengths of said walls and non-structural boundaries to said portable computer, and said angles of vertices between adjacent said walls and non-structural boundaries are also transmitted to said portable computer, wherein said portable computer is programmed with CAD software that calculates space polygons representing spaces and subspaces from said lengths of said walls and non-structural boundaries and said angles of vertices between adjacent walls and non-structural boundaries and assures that all of said space polygons close;

capturing information about how each space and subspace in said existing structure is used;

based on said captured information, assigning usage codes to said spaces and subspaces for how each space and subspace is used and inputting said usage codes into said portable computer to be associated with the polygons representing those spaces and subspaces;

whereby space and usage information for said spaces and subspaces within said existing structure is surveyed eliminating the need to create a floor plan that captures structural details.

5. A process according to claim 4, further comprising after said space polygons for a space have been closed, proceeding to a succeeding adjacent space and repeating the above steps for each adjacent space until all said spaces and subspaces in said structure have been surveyed.

6. A process according to claim 4, further comprising extruding said space polygons to create 3 dimensional representations of said spaces and subspaces.

* * * * *